US006815782B2

(12) United States Patent
Stadler et al.

(10) Patent No.: US 6,815,782 B2
(45) Date of Patent: Nov. 9, 2004

(54) MINIATURE ELECTROSTATIC ACTUATION DEVICE AND INSTALLATION COMPRISING SUCH DEVICES

(75) Inventors: Eric Stadler, La Trouche (FR); Julien Charton, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/444,463

(22) Filed: May 22, 2003

(65) Prior Publication Data

US 2004/0012060 A1 Jan. 22, 2004

(30) Foreign Application Priority Data

May 23, 2002 (FR) .......................................... 02 06293

(51) Int. Cl.[7] .............................................. H01L 29/82
(52) U.S. Cl. ...................... 257/415; 257/416; 257/417; 257/418; 257/419; 257/420
(58) Field of Search ................................ 257/415, 416, 257/417, 418, 419, 420, 413, 414; 385/16; 359/871, 223, 298, 849; 73/514.32

(56) References Cited

U.S. PATENT DOCUMENTS

| | | | | |
|---|---|---|---|---|
| 2002/0033048 A1 | * | 3/2002 | Mcintosh et al. | 73/514.32 |
| 2003/0174421 A1 | * | 9/2003 | Rodgers et al. | 359/871 |
| 2003/0202735 A1 | * | 10/2003 | Dunec et al. | 385/16 |

FOREIGN PATENT DOCUMENTS

EP 0 592 469 B1 5/1997 ........... F16K/11/02

OTHER PUBLICATIONS

Jens Branebjerg; et al; A New Electrostatic Actuator Providing Improved Stroke Length and Force; Micro Electro Mechanical Systems 92; Feb. 4–7, 1992; pp. 6–11.

* cited by examiner

*Primary Examiner*—Nathan J. Flynn
*Assistant Examiner*—Fazli Erdem
(74) *Attorney, Agent, or Firm*—Thelen Reid & Priest, LLP

(57) ABSTRACT

The invention relates to a miniature electrostatic actuation device (100) capable of generating movements along a determined direction (F), comprising pairs of electrodes (4) of which the mobile electrodes (8) may be pulled into contact with a fixed electrode (6) on a variable pull-in surface that varies as a function of the voltage applied between these pairs of electrodes. According to the invention, the device also comprises an actuation element (12) connected to the mobile electrodes (8), the element (12) being capable of occupying a rest position and of being guided along the determined direction (F) when the voltage applied between the electrodes in each pair (4) varies, the device comprising return arms (14) capable of pulling the actuation element (12) back towards its rest position, when the voltage applied between the two electrodes in each pair of electrodes is reduced.

To be applied to actuation of continuously deformable micro-mirrors.

18 Claims, 6 Drawing Sheets

MINIATURE ELECTROSTATIC ACTUATION DEVICE AND INSTALLATION COMPRISING SUCH DEVICES

CROSS-REFERENCE TO RELATED APPLICATION

This application claims priority to French application no. 02 06293, filed on May 23, 2002, entitled: Miniature Electrostatic Actuation Device and Installation Comprising Such Devices.

TECHNICAL DOMAIN

This invention relates to a miniature electrostatic actuation device capable of generating movements in a determined direction, these movements being obtained through at least one pair of electrodes, one of which can be moved with respect to the other, under the effect of an electrostatic force exerted between the two electrodes subjected to a potential difference.

The invention also relates to an installation comprising such miniature electrostatic actuation devices, the devices being placed adjacent to each other.

For example, the invention relates to a MEMS (Micro Electro Mechanical System) type component in domains such as astrophysics or ophthalmology, particularly in order to actuate optical instruments such as continuously deformable micro-mirrors.

Moreover, the invention is equally applicable to any other micro-system that needs to be actuated in translation along a determined direction.

STATE OF THE PRIOR ART

Several implementations have already been proposed in this technical field.

Firstly, prior art is familiar with conventional miniature electrostatic actuation devices comprising a fixed electrode and a mobile electrode located parallel to the fixed electrode and at a distance from it.

When an electric voltage is applied between the two electrodes, an electrostatic force is generated causing displacement of the mobile electrode with respect to the fixed electrode, along a direction approximately perpendicular to the plane in which the fixed electrode is located. Thus, when such a device is being used, the resulting displacement is capable of generating translation movements along the determined direction, in this case corresponding to the displacement direction of the mobile electrode.

However, this type of conventional actuation device has many disadvantages that strongly disturb its operation. In particular, these disadvantages occur when such a device is being used to continuously actuate a deformable micro-mirror.

These disadvantages include the sudden pull-in phenomenon applied to this type of device. Conventional electrostatic devices normally have a characteristic instability that results in sudden pull-in of the mobile electrode in contact with the fixed electrode when the voltage applied between the two electrodes exceeds a given value. Consequently, the controlled movement distance of the mobile electrode corresponds to a distance that is very much restricted from the initial distance separating the two electrodes to which a potential difference has not yet been applied. The result is that conventional devices are incapable of generating controlled high amplitude movements in the given direction.

Another disadvantage related to this type of device relates to the lack of linearity between the applied voltage and the generated displacement of the mobile electrode. This constraint occurs throughout the usage range and makes it very difficult to control the device, obviously to the detriment of the actuation precision of the micro-system to be controlled.

Finally, it should be noted that the force developed by movement of the mobile electrode remains relatively small, particularly with respect to the average force required to correctly actuate a continuously deformable micro-mirror.

Prior art proposed another miniature electrostatic actuation device described in document EP-A-0 592 469 in order to overcome these various problems.

The document mentioned above describes a miniature actuation device comprising a diaphragm type membrane and a support on which an electrically conducting layer is supported, together with an insulating layer inserted between the diaphragm and the conducting layer. In the inactive state, in other words when no electrical voltage is applied between the electrically conducting diaphragm and the conducting layer, only the ends of the diaphragm are pulled in to come into contact with the conducting layer. The other part of the diaphragm is then at a distance from the conducting layer, so as to define an empty space with it.

When the device is actuated by the application of a voltage between the two electrically conducting elements, the part of the diaphragm at a distance from the conducting layer might progressively get pulled in to come into contact with the conducting layer, symmetrically about a central part of the diaphragm and from its ends. It should be noted the symmetry of the device introduces a translation displacement of the central part of the diaphragm along a direction approximately perpendicular to the conducting layer.

The actuation device described above is advantageous to the extent that the diaphragm used may be gradually pulled into contact with the conducting layer so as to make the volume of the empty space almost zero, without introducing the "pull-in" type phenomenon causing the diaphragm to come into sudden contact with the conducting layer. In this way, the controlled stroke of the central part of the diaphragm that may be moved along a determined direction corresponds approximately to the initial distance between the central part of the diaphragm and the conducting layer. This stroke is thus fully optimised as a function of the design of such a device.

Furthermore, experiments carried out on this device have demonstrated the existence of linearity between displacement of the central part of the diaphragm and the applied voltage between the conducting elements, this linear relation having been observed over a wide usage range of the device.

Furthermore, as mentioned above, the diaphragm may gradually be pulled into contact with the conducting layer from the ends of this diaphragm, the contact surface between the diaphragm and the conducting layer depending on the electrical voltage applied between these two elements. As a result, it can be seen that a portion of the diaphragm that is not yet in contact and that is directly along the extension of a part that is in contact is extremely close to the conducting layer, at all times while the device is being activated. The force developed by displacement of the diaphragm is inversely proportional to the square of the distance separating the diaphragm and the conducting layer, therefore this force is very high within the usage range of the device.

Note that the progressive pull-in phenomenon between two conducting elements, known particularly under the term "zipping", is also described in the document entitled "A New Electrostatic Actuator providing improved Stroke length and force, MEMS' 92, J. Branebjerg; P. Gravesen".

Although the miniature device described in document EP-A-0 592 469 solves problems related to conventional electrostatic actuation devices, it does have a major disadvantage.

After an activation phase of such a device that caused pull-in of the diaphragm into contact with the conducting layer, a simple action to reduce the voltage applied between these two elements is not sufficient to put the diaphragm back into its initial position. Thus, in order to overcome this disadvantage, the device also comprises means for injecting gas under pressure inside the empty space formed between the diaphragm and the conducting layer. In this way, when gas is injected under pressure into the empty space, a force is applied over the entire diaphragm so that the diaphragm can resume its initial shape and position.

Nevertheless, this type of arrangement very much complicates the design of this type of device, such that costs related to the manufacture and use of pressurised gas injection means are excessive compared with the total cost of the overall device.

Furthermore, due to the operating mode of the means necessary to put the diaphragm back into its initial position, the diaphragm and/or the insulating layer must necessarily be sealed in order to assure good cooperation with the means of injecting the pressurised gas, thus naturally introducing constraints in the geometry and in the choice for materials that can be used to make the diaphragm and/or the insulating layer of the device.

OBJECTS OF THE INVENTION

Therefore, the initial object of the invention is to propose a miniature electrostatic actuation device capable of generating movements along a determined direction, the device comprising at least one pair of electrodes separated by an insulating layer, one of which is mobile, the device at least partially correcting the disadvantages mentioned above related to embodiments in prior art.

More precisely, the object of the invention is to present a device with a simplified design and at lower cost than actuation devices known according to prior art.

Another object of the invention is to propose an installation comprising several miniature electrostatic actuation devices, like those that also satisfy the object of the invention mentioned above.

To achieve this, the invention is related to a miniature electrostatic actuation device capable of generating movements in a given direction, the device comprising at least one pair of electrodes separated by an insulating layer, each pair of electrodes being composed of a fixed electrode attached to a device support and a mobile electrode, at least one portion of which is located at a distance from the fixed electrode when the device is in an inactive state, the device being capable of being activated by means of an electrical voltage applied between the two electrodes in each pair causing the mobile electrode to be pulled into contact with the fixed electrode on a variable pull-in surface that varies as a function of the voltage applied between the two electrodes. According to the invention, the device also comprises an actuation element connected to the portion of each mobile electrode located at a distance from the associated fixed electrode, the actuation element capable of occupying a rest position when the device is in an inactive state, and able of being guided along the determined direction when the voltage applied between the two electrodes in each pair varies, the device also comprising at least one return arm capable of pulling the actuation element back towards its rest position when the voltage applied between the two electrodes in each pair of electrodes is reduced.

The miniature actuation element according to the invention has all the advantages related to the zipping effect used between each pair of electrodes in the device, namely quasi-linearity between displacement of the actuation element and the voltage applied between the electrodes in each pair of electrodes, the long stroke of the actuation element, and the large force developed during movements of this actuation element.

Furthermore, the device also comprises simple mechanical means of putting the actuation element back into place in its rest position following a device actuation phase. These means consist at least of a return arm capable of generating a force opposing the electrostatic force created between the electrodes in each pair of electrodes. The result of this is that it is easily possible to design a device in which the return arm(s) generate(s) a force exceeding the electrostatic force generated when the applied voltage drops below a predetermined value, this consequently causing the actuation element to automatically return to its rest position.

Furthermore, when the voltage applied between the electrodes in each pair of electrodes is simply reduced, the generated electrostatic force reduces such that the return arm(s) provided is (are) capable of bringing the actuation element back towards its rest position, the return movement stopping when the generated electrostatic force exceeds the force created by each return arm.

Preferably, each return arm can work in tension or in bending, and is carried by a support element for each return arm, the return arm being fixed to the support of the device.

Furthermore, the device may be designed such that when the actuation element is in its rest position, the entire mobile electrode of each pair of electrodes is kept at a distance from the fixed electrode by each return arm, the mobile electrode comprising a first end composed of the portion connected to the actuation element, and a second end composed of a priming area that may be pulled into contact with the fixed electrode when a priming voltage is applied between the two electrodes. Thus, in this configuration, the mobile electrodes may be made approximately plane, and consequently there is no longer any need to introduce complex three-dimensional shapes to ensure that there is a part in contact with the fixed electrode and a part kept at a distance from the fixed electrode when the device is not activated, as was the case in prior art. Therefore it becomes much easier to make the mobile electrodes, for example they can be made by photolitho-engraving, or by laser cutout in a thin plate of electrically conducting material.

For each pair of electrodes, it is also possible to arrange for the mobile electrode to include an arm that is curved in a plane approximately orthogonal to the determined direction of displacement of the actuation element, the curved arm being connected firstly to the actuation element of the device, and secondly to the priming area of the mobile electrode.

Advantageously, the curvature formed on the mobile electrodes enables the miniature actuation element to be very compact, while enabling the actuation element to move along a very long stroke.

According to a first preferred embodiment of this invention, the actuation element can be guided along the determined displacement direction using means providing translation guidance of the actuation element coupled to the device. It should be noted that these means are provided since the movement transmitted to the actuation element by any one of the mobile electrodes that is pulled in, follows a trajectory that is not linear. Therefore, the purpose of this guide means is to transform the complex movement created at the end of the mobile electrode into a translation movement along the determined direction.

Preferably, the actuation element may be guided along the determined displacement direction through several electrode pairs comprising a common fixed electrode with an approximately plane shape and mobile electrodes arranged symmetrically with respect to the actuation element, the determined direction of displacement of the actuation element then being approximately orthogonal to the fixed electrode.

Due to the symmetry between the different mobile electrodes connected to the actuation element of the device, the movements transmitted to the device are partially compensated to introduce a movement along a determined single direction approximately orthogonal to the fixed electrode.

The actuation element may comprise four pairs of electrodes in which the mobile electrodes are identical and are distributed at 90° around the actuation element, to be inscribed in a hollowed out space, with a square cross section formed in the support element of each return arm of the device.

According to a second preferred embodiment of this invention, the mobile electrodes have a disk shaped priming area, and an arm curved in the shape of a circular ring extending approximately all the way around the priming area.

According to a third preferred embodiment of this invention, the mobile electrodes have a rectangular shaped priming area and a curved L-shaped arm.

According to a fourth preferred embodiment of this invention, the device comprises three pairs of electrodes, in which the mobile electrodes are identical and are designed to be inscribed within a hollowed out space with a hexagonal section formed in the support element of each return arm of the device. The mobile electrodes are then preferably within a priming area extending over a sector covering about 120° around the edge of an internal wall in the hollowed out space with a hexagonal section, the priming area being prolonged by a spiral curved arm.

Preferably, for each of the preferred embodiments described above, each return arm is also fixed to one of the elements among the group composed of the actuation element and the portion of the mobile electrode connected to the actuation element of each pair of electrodes.

Furthermore, it is possible to arrange that the support element of each return arm, the actuation element, the mobile electrode in each pair of electrodes and each return arm of the device are made in a single piece, from an electrically conducting material.

Finally, for each pair of electrodes, it is possible for the actuation element and the mobile electrode to be connected by means of an elastic connection in order to absorb parasite displacements parallel to the fixed electrode, between the mobile electrode and the actuation element of the device.

Another purpose of the invention is an installation comprising several miniature electrostatic actuation elements like those described above and also the subject of the invention, the devices being adjacent to each other and provided with a common support.

Other advantages and characteristics of the invention will become clearer in the detailed non-limitative description given below.

BRIEF DESCRIPTION OF THE DRAWINGS

This description will be made with respect to the attached drawings in which.

DETAILED DESCRIPTION OF PREFERRED EMBODIMENTS

Figure 1:
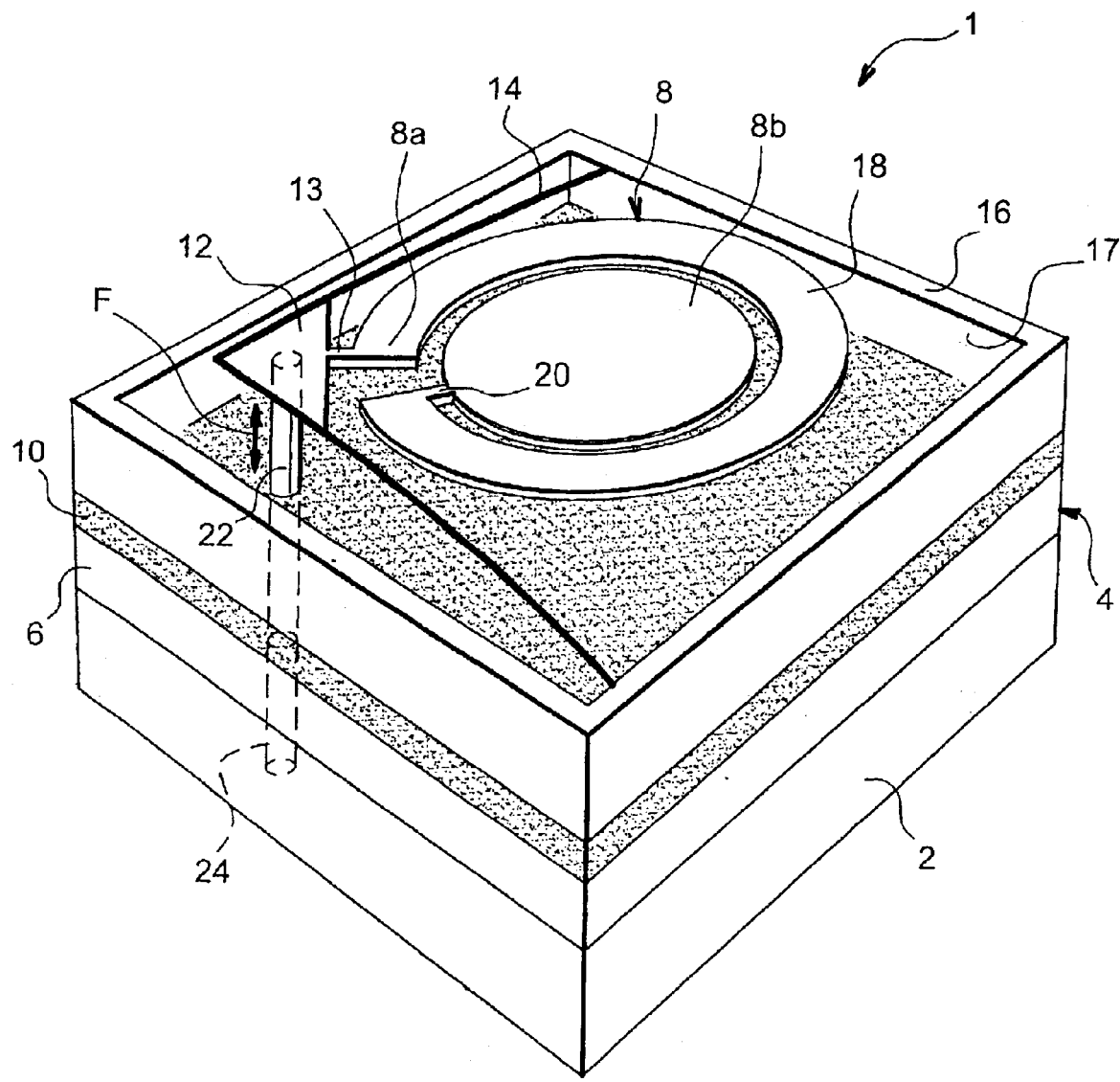
FIG. 1 shows a perspective diagrammatic view of a miniature electrostatic actuation element according to a first preferred embodiment of this invention, when this device is in an inactive state.

FIG. 1 shows a miniature electrostatic actuation element 1 according to a first preferred embodiment of this invention, the device 1 being designed to generate movements in a determined direction symbolically shown by arrow F.

The device 1 comprises a support 2 on which a pair of electrodes 4 is supported. The pair of electrodes 4 comprises an approximately plane and horizontal fixed electrode 6 fixed to the support 2 of device 1. Furthermore, the pair of electrodes 4 also includes a mobile electrode 8, at least one portion of which is located at a distance from the fixed electrode 6, when the device 1 is in an inactive state (FIG. 1).

In this first preferred embodiment, when the device 1 is in an inactive state, the mobile electrode 8 is approximately plane and is entirely at a distance from the fixed electrode 6, approximately parallel to it. It should be noted that the fixed electrode 6 is coated with an insulating layer 10 preventing direct contact between the fixed electrode 6 and the mobile electrode 8 when the device 1 is activated (described later). Obviously, the insulating layer 10 could also be provided on the mobile electrode 8 of the device 1.

The miniature actuation element 1 comprises an actuation element 12 such as a mobile plate, connected to a first end 8a of the mobile electrode 8 through an elastic link 13, this actuation element 12 being designed to describe movements in the determined direction F corresponding approximately to a direction orthogonal to the fixed electrode 6 and the support 2 of device 1. It should be noted that when the device 1 is in an inactive state, the actuation element 12 preferably extends around the same plane as the mobile electrode 8.

In the inactive state shown in FIG. 1, namely when no voltage is applied between the two electrodes 6 and 8 of the device 1, the mobile electrode 8 is kept at a distance from the fixed electrode 6 by at least one return arm 14 extending longitudinally and approximately parallel to the fixed electrode 6. Each of the return arms 14 also holds the actuation element 12 in a rest position, corresponding to a position in which the device 12 is also located at a distance from the fixed electrode 6 of the device 1.

It is preferable if there are two of the return arms 14 that can work in bending and in tension. These arms 14 are connected firstly to the actuation element 12, and secondly to a support element 16 fixed to the insulating layer 10 and in which a hollowed out space 17 is provided in which a mobile electrode 8 can be fitted. In the embodiment shown, the return arms 14 are arranged with respect to each other so as to form an angle equal to about 90°. Without going outside the scope of the invention, it would also be possible for the support element 16 to be fixed to the support 2 of the device 1 directly.

Still with reference to FIG. 1, the mobile electrode 8 of the device 1 also comprises a second end consisting of a priming area 8b that can be fixed in contact with the fixed electrode 6 when a priming voltage is applied, through means (not shown) of applying a voltage between the two electrodes 6 and 8.

Preferably, the mobile electrode 8 consists of a priming area 8b and a curved arm 18 connected to the priming area 8b through a flexible link 20, the curved arm 18 extending as far as the first end 8a connected to the actuation element 12. It should be noted that the curvature of the arm 18 is made in a plane approximately orthogonal to the determined direction F of displacement of the actuation element 12.

Furthermore, the actuation element 1 comprises translation guide means 22, 24 for the actuation element 12, to enable this actuation element to move in a guided manner along a determined direction F following transmission of a movement from the first end 8a of the mobile electrode 8. For example, the guide means 22, 24 may be in the form of a guide rod 22 fixed to the actuation element 12 and that can slide in a reaming 24 with an axis parallel to the determined direction F, this reaming 24 passing through one or several elements of the device 1 such as the insulating layer 10, the fixed electrode 6 or the support 2.

Operation of the miniature actuation element 1 will now be described with reference to FIGS. 2a to 2d and FIG. 3, representing a graph in which the abscissa axis represents the voltage in volts applied between the two electrodes 6 and 8, and for which the ordinates axis corresponds to the distance in micrometers at which the actuation element 12 is located in its rest position.

Figure 2A:
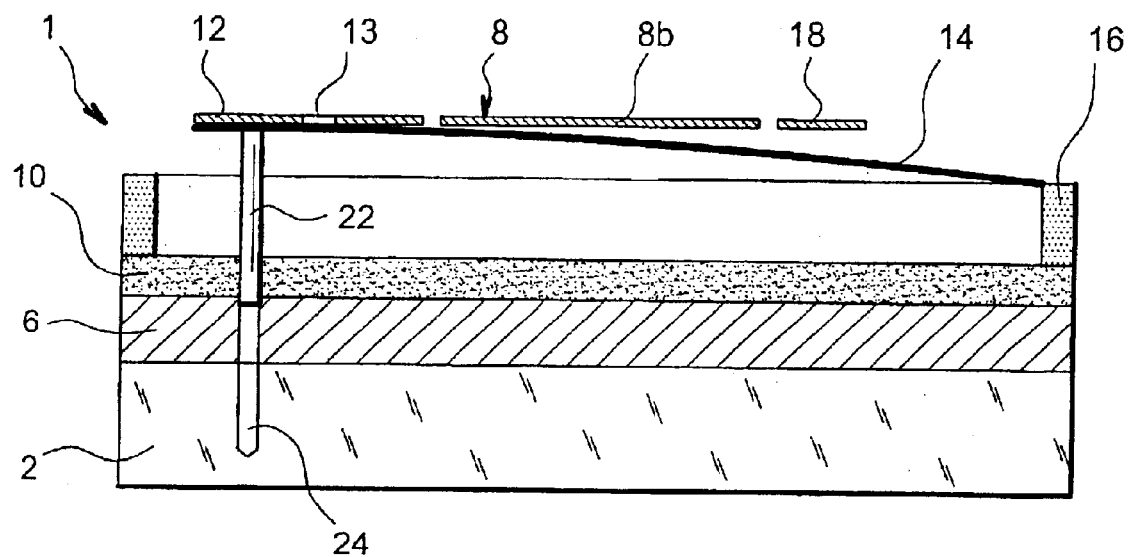
FIGS. 2a to 2d show diagrammatic sectional views of the actuation element shown in FIG. 1, in different configurations explaining operation of this device.

FIG. 2a shows the actuation element 1 in the inactive state, identical to the state shown in FIG. 1.

Therefore the electrical voltage applied between the two electrodes 6 and 8 is zero and the assembly consisting of the mobile electrode 8 and the actuation element 12 is kept entirely at a distance from the fixed electrode 6, through the return arm 14 of the device 1. As mentioned above, it should be noted that in this state symbolised by point A in the graph in FIG. 3, the actuation element 12 of the device 1 occupies its rest position.

When a voltage is applied between the electrodes 6 and 8, an electrostatic force is created between these electrodes and causes displacement of the priming area 8b of the mobile electrode 8 towards the fixed electrode 6. As the applied voltage increases, the actuation element 12 also moves slightly towards the fixed electrode 6 until the voltage reaches a priming voltage causing sudden pull-in of the priming area 8b into contact with the fixed electrode 6. This sudden pull-in of the priming area 8b is comparable to the pull-in effect encountered in conventional electrostatic actuation elements according to prior art, and causes a displacement of the actuation element 12 that is very significant compared with displacements observed during application of lower voltages. The displacement of the mobile electrode 8 generated by the electrostatic force created between the two electrodes 6 and 8, is authorised by the flexibility of this electrode 8 so that it is free to deform in a direction approximately parallel to the direction F of displacement of the device 12, and also by the deformation of the return arms 14 in tension and in bending. Furthermore, the movement transmitted to the actuation element 12 is transformed into a translation movement using the guide rod 22 and the reaming 24, the elastic connection 13 absorbing parasite movements perpendicular to the direction F between the mobile electrode 8 and the actuation element 12.

Figure 2B:
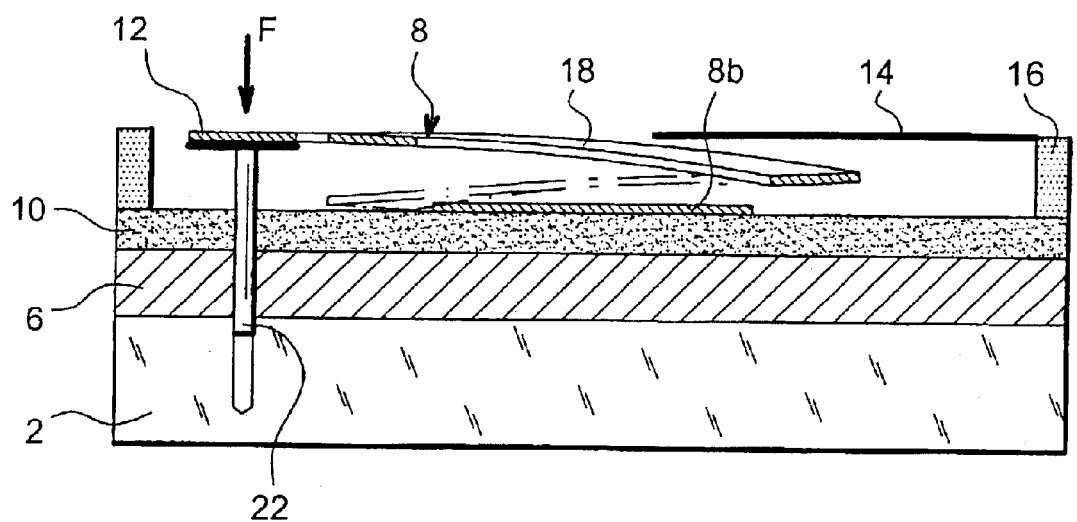
Figure 3:
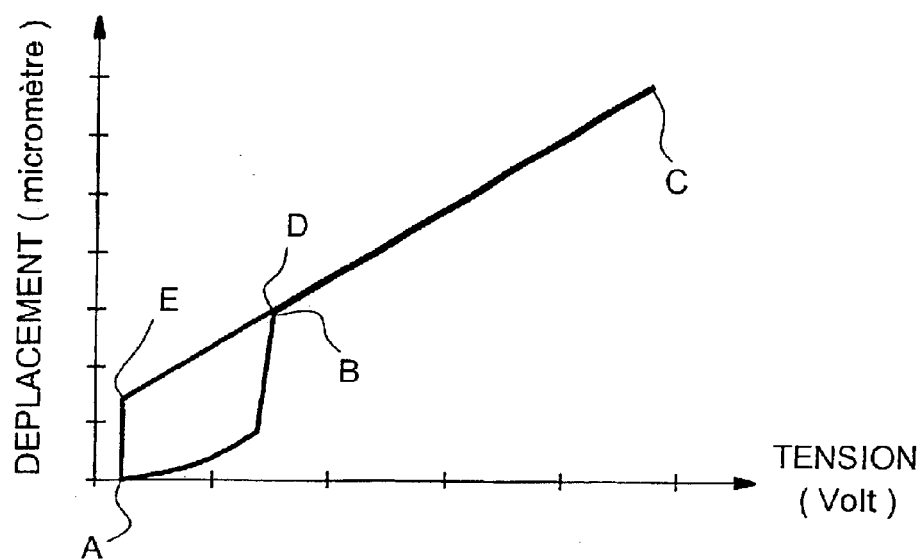
FIG. 3 shows a graph representing the displacement of the actuation element of the device shown in FIG. 1, as a function of the electrical voltage applied between the two electrodes of the device.

FIG. 2b shows the state of the device 1 in which the priming area 8b has just been brought into contact with the fixed electrode 6, and corresponds to point B in the graph in FIG. 3. Note that it is also possible to provide a mobile electrode 8 with the initial shape shown in FIG. 2b, in which one of its ends would initially be pulled in contact with the fixed electrode 6, and its other end would be at a distance from it, without going outside the scope of the invention.

The electrode 8 can be made by stacking at least two layers of materials with different coefficients of expansion. The "curved" shape shown in FIG. 2b can thus be obtained by applying an appropriate heat treatment to produce a bimetallic strip effect.

For example, the priming voltage required for bringing the priming area 8b into contact with the fixed electrode 6 is 30 V, while the distance through which the actuation element 12 travels from its rest position after coming into contact with the priming area 8b is 6 µm.

After the priming area 8b of the mobile electrode 8 is pulled in, the device 1 comes into a state in which a linear relation is obtained between the applied voltage and the displacement of the actuation element 12.

Figure 2C:
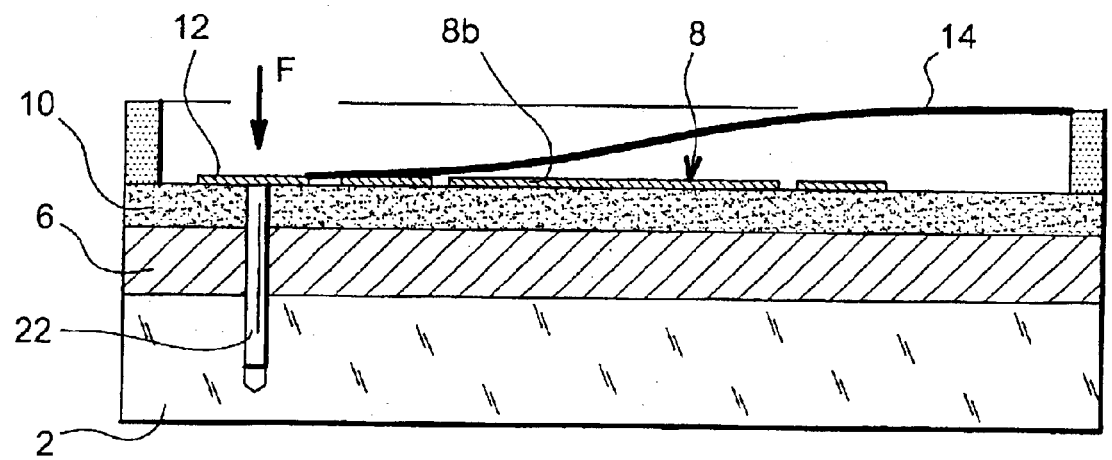

Thus, an increase in the voltage causes the curved arm 18 of the mobile electrode 8 to be progressively pulled into contact with the fixed electrode 6, the pulling in surface between these two electrodes 6 and 8 being variable as a function of the voltage applied between them in accordance with the principle of the "zipping effect". This increase may continue until the actuation element 12 comes into contact with the insulating layer 10 in contact with the fixed electrode 6, still as a result of the deformation of the return arms 14, the link 13 and the flexibility of the mobile electrode 8. This maximum activation state of the device 1 is shown in FIG. 2c, and corresponds to point C in the graph in FIG. 3. It would be possible to adapt the geometry of this device 12 and provide a non-conducting area such as a hole below this element, to facilitate contact between the insulating layer 10 and the actuation element 12.

Still as an example, the maximum displacement of the actuation element 12 may be as high as 12 µm, while the voltage to be applied to obtain this stroke is less than 100 V. The force developed by the displacement of the mobile electrode 8 is of the order of 100 µN, compared with about 1 µN in embodiments according to prior art.

When the actuation element 1 is in the maximum activation state, the voltage applied between the two electrodes 6 and 8 may be reduced to cause displacement of the actuation element 12 towards its rest position, by means of a mechanical return action exerted by the return arms 14. Reducing the applied voltage causes a reduction in the electrostatic force between the two electrodes 6 and 8, such that a portion of the mobile electrode 8 is no longer affected by this electrostatic force, and may be separated from the fixed electrode 6 under the action of the return arm 14. Thus, the actuation element 12 is returned towards its rest position, the return being stopped when the electrostatic force generated by the voltage applied at the end of the reduction is greater than the force developed by the return arms 14.

As the voltage is being reduced, the same linear relation as that observed while the voltage is increased is then kept, such that when the applied voltage is reduced down to the priming voltage, the device 1 is in a state symbolised by point D in the graph in FIG. 3, this point D being approximately coincident with point B on the same graph.

Figure 2D:
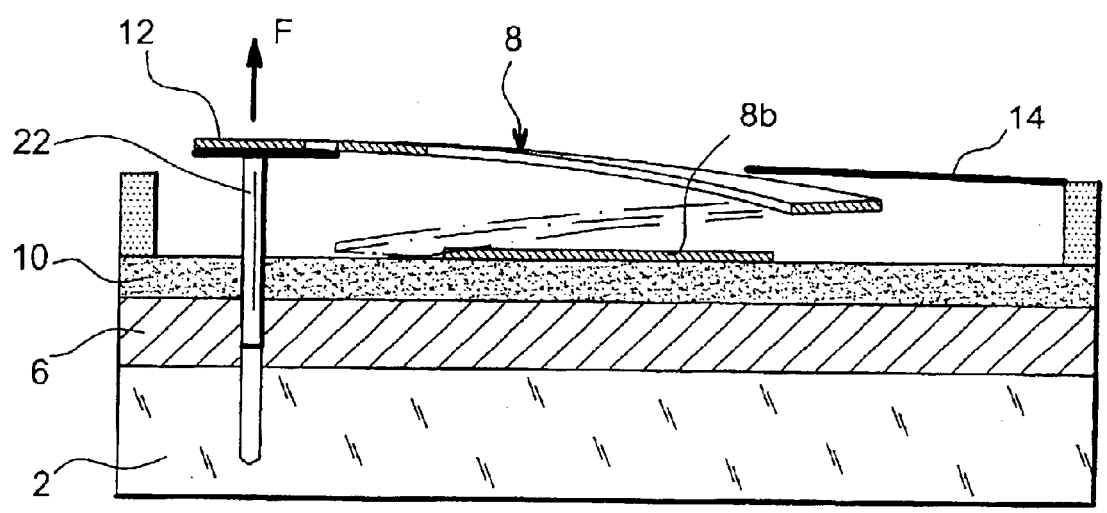

However, it is also observed that linearity is conserved when the applied voltage drops below the priming voltage. This linearity is maintained until the applied voltage is reduced to a predetermined value (FIG. 2d and point E in the graph in FIG. 3). Below this predetermined value, the return arms 14 generate a force greater than the electrostatic force created between the electrodes 6 and 8, consequently forcing the actuation element 12 to return to its rest position.

It should be noted that the predetermined voltage corresponding to point E in FIG. 3, for example equal to only a few volts, is calculated as a function of the technical parameters of the various elements forming device 1.

Thus, when the miniature device 1 is in a state symbolised by point E in the graph in FIG. 3, the voltage may be increased to bring it back into the linear variation range between points E and C, or the voltage may be reduced so that the actuation element 12 is brought back into its rest position, through return arms 14.

For example, the linear area between points E and C in the graph in FIG. 3 may correspond to a controlled vertical stroke of the actuation element 12 of about 11 μm. An arbitrary micro-system (not shown) can then be actuated by the actuation element 12 over the same distance.

Figure 4:
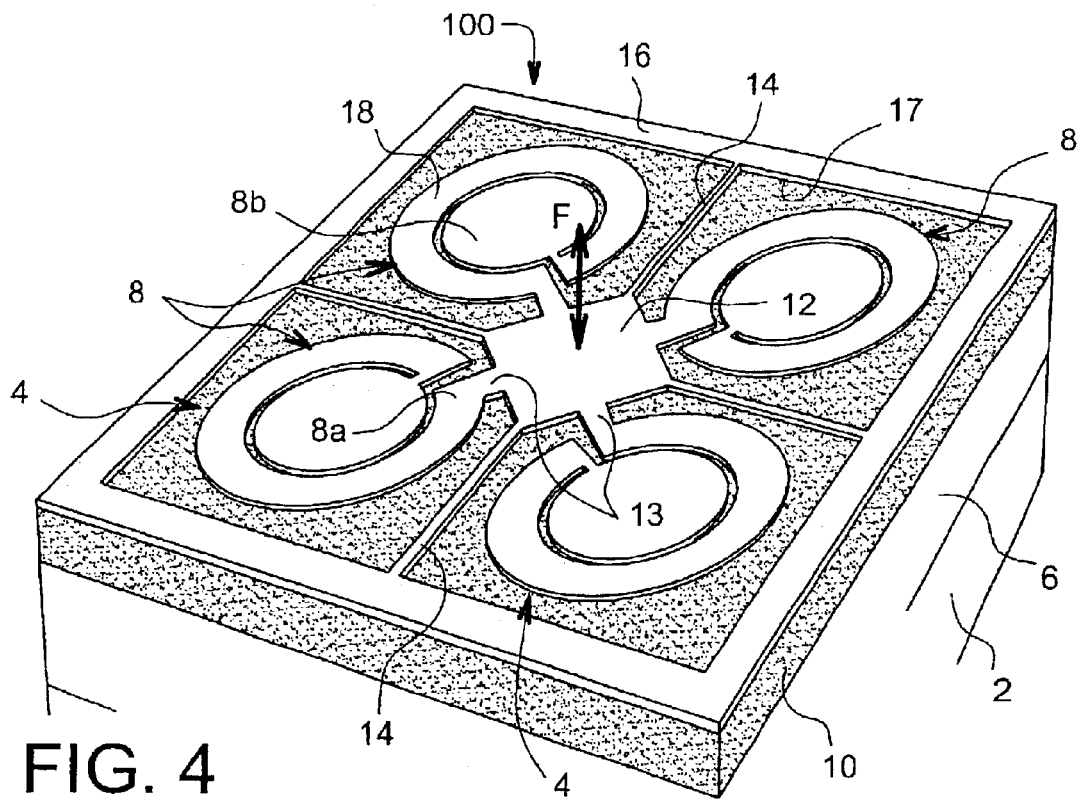
FIG. 4 shows a perspective diagrammatic view of a miniature electrostatic actuation element according to a second preferred embodiment of this invention, when this device is in an inactive state.

FIG. 4 shows a miniature electrostatic actuation element 100 according to a second preferred embodiment of this invention, this device 100 being designed to generate movements in a determined direction symbolised by the arrow F.

The device 100 shown is relatively similar to the device 1 in the first preferred embodiment described above, with the difference that it comprises four electrode pairs instead of only one, and that it no longer has any translation guide means 22, 24.

The device 100 comprises four electrode pairs 4 comprising a plane common fixed electrode 6 coated with an insulating layer 10, the fixed electrode 6 being fixed to a support 2 of the device 100. The four mobile electrodes 8 are identical to the electrode described in the first preferred embodiment, and are arranged symmetrically at 90° around an actuation element 12 to which these electrodes 8 are connected through an elastic link 13.

The mobile electrodes 8 are inscribed within a hollowed out space 17 with a square cross section, formed in a support element 16 of the return arms 14, that also have a square cross section. In this second preferred embodiment, there are four return arms 14 extending approximately longitudinally and parallel to the fixed electrode 6, from each side of the support element 16 forming a frame around the mobile electrodes 8, as far as the actuation element 12 located in the centre of the hollowed out space 17 with a square cross section. In this manner, each return arm 14 is placed so that it is located between two mobile electrodes 8 of the device 100.

As can be seen in FIG. 4, the priming area 8b of each mobile electrode 8 is in the shape of a disk, and the curved arm 18 is in the shape a circular ring extending approximately all around the disk shaped priming area 8b. Moreover, the mobile electrodes 8 are placed in the hollowed out space 17 such that each circular ring shaped curved arm 18 is close to the two directly adjacent sides of the support element 16 forming the frame.

In this preferred embodiment, the advantage is the possibility of making the return arms 14, the mobile electrodes 8, the support element 16 and the actuation element 12 in a single piece and from an electrically conducting material, using techniques similar to micro-electronic techniques. Thus, it is relatively easy to apply the same voltage to each of the electrode pairs 4, to generate an identical displacement of each of the mobile electrodes 8, and consequently to displace the actuation element 12 along the determined direction F orthogonal to the fixed electrode 6 and the support 2 of the device 1.

Furthermore, it can be seen that the mobile electrodes 8 can be powered in common or separately, without going outside the scope of the invention.

Operation of the device 100 is similar to operation of the device 1 in the first preferred embodiment, with the difference that the symmetry of the mobile electrodes 8 with respect to the actuation element 12 eliminates the need for the presence of translation guide means for the actuation element 12. When the mobile electrodes 8 are moved after they are brought into contact with the fixed common electrode 6, the first end 8a of the mobile electrodes 8 transmits a movement to the actuation element 12, this movement being broken down into a translation along a determined direction F, and a translation along a direction perpendicular to the determined direction F. Thus, due to the symmetric design of the device 100 and the identical voltage applied to each of the electrode pairs 4, translations along the directions perpendicular to the determined direction F and other movements such as tipping and rotation may mutually compensate, such that the resulting movement of the actuation element 12 is only made along a determined direction F approximately orthogonal to the fixed electrode 6.

Figure 5:
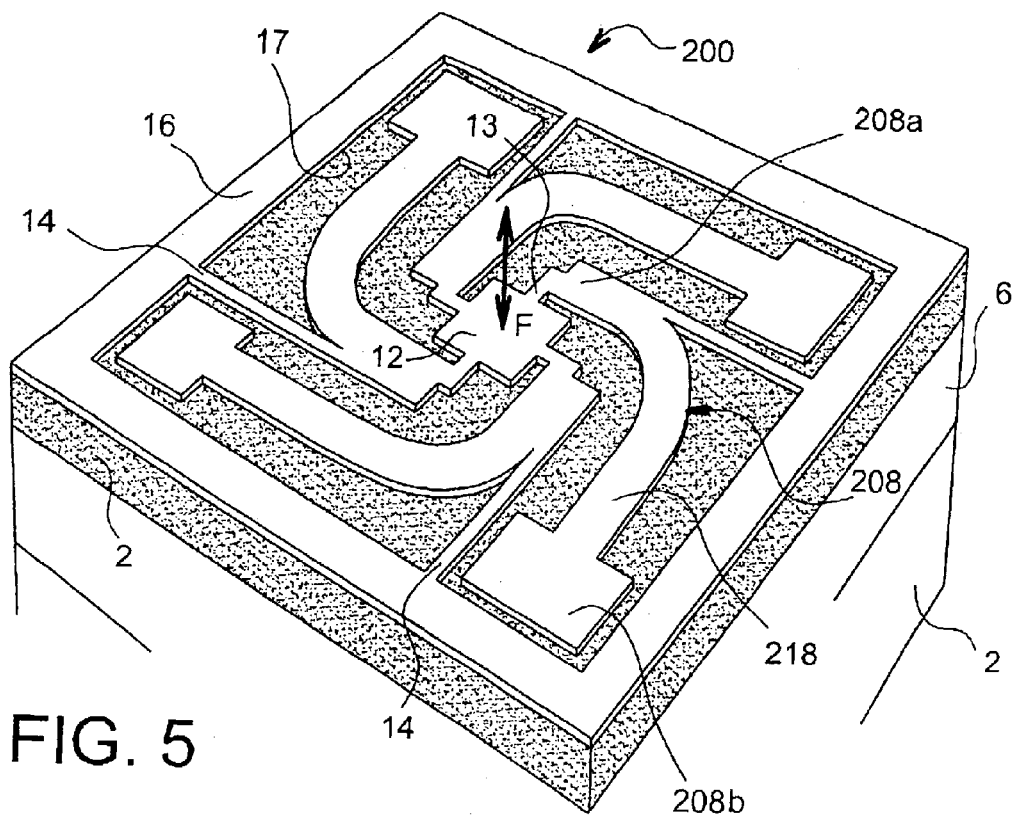
FIG. 5 shows a perspective diagrammatic view of a miniature electrostatic actuation element according to a third preferred embodiment of this invention, when this device is in an inactive state.

FIG. 5 shows a miniature electrostatic actuation element 200 according to a third preferred embodiment of this invention, this device 200 being capable of generating movements in a determined direction symbolised by the arrow F.

The device 200 is relatively similar to the device 100 in the second preferred embodiment described above, with the difference that the four mobile electrodes 208 are designed differently from the mobile electrodes 8 in the second preferred embodiment.

The mobile electrodes 208 are all identical, and each comprises a first end 208a connected to the actuation element 12 of the device 200. A curved arm 218 extends from this first end 208a in the form of a curved L. Furthermore, a priming area 208b in the form of a rectangle is located at the other end of the curved arm 218. As can be seen in FIG. 5, each priming area 208b in a shape of a rectangle is placed close to a right angle of the hollowed out space 17 with a square section formed in the support element 16 forming a frame around the mobile electrodes 208, to match this right angle fairly well.

Moreover, one special feature of this third preferred embodiment of this invention lies in the fact that each return arm 14 is connected firstly to the support element 16, and secondly to the first end 208a of a mobile electrode 208. Thus, the actuation element 12 is brought back into place using the return arms 14 by displacement of the mobile electrodes 208, rather than directly by displacement of the actuation element 12. Obviously, this design possibility would be possible for all proposed preferred embodiments.

Figure 6:
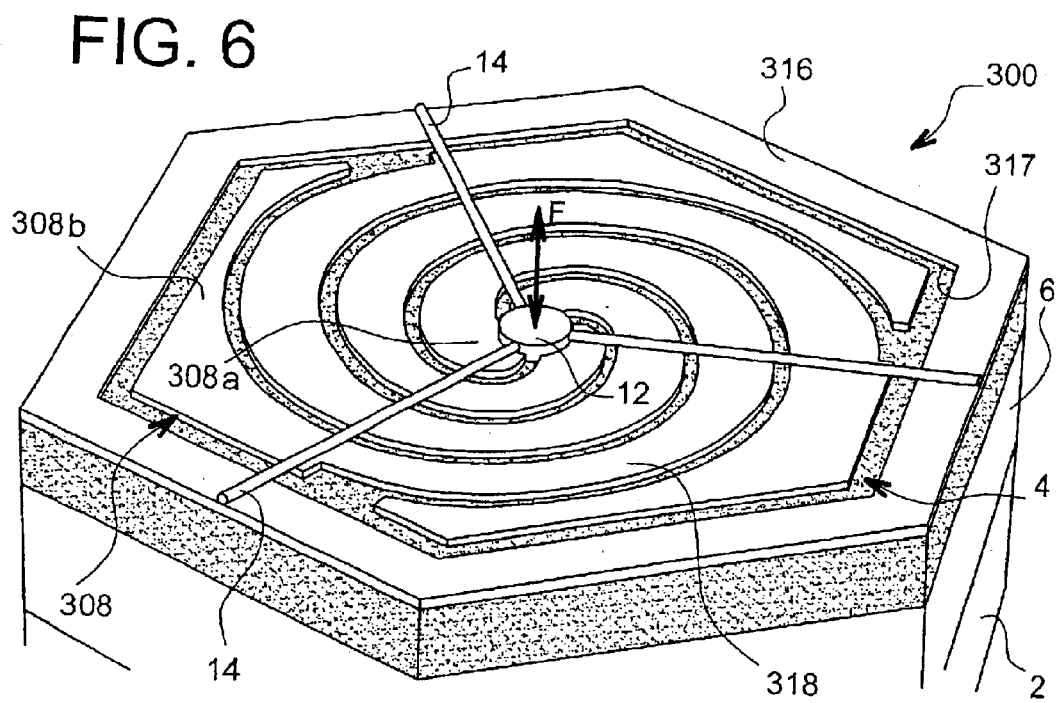
FIG. 6 shows a perspective diagrammatic view of a miniature electrostatic actuation element according to a fourth preferred embodiment of this invention, when this device is in an inactive state.

FIG. 6 shows a miniature electrostatic actuation element 300 according to a fourth preferred embodiment of this invention, this device 300 being designed to generate movements in a determined direction symbolised by the arrow F.

The device 300 is relatively similar to devices 100 and 200 of the second and third preferred embodiments described above, with the difference that it comprises a support element 316 and mobile electrodes 308 with different shapes.

The support element 316 of the return arms 14 is approximately hexagonal and it comprises a hollowed out space 317 with a section that is also hexagonal. Furthermore, the device 300 also comprises three mobile electrodes 308, each comprising a first end 308a connected to the actuation element 12 of the device 300. A curved arm 318 extends from this first end 308a, in the form of a spiral. Furthermore, a priming area 308b extending over a sector of about 120° around the border of an inside wall of the hollowed out space 317 is located at the other end of the curved arm 318.

In this fourth preferred embodiment of this invention which operates in a similar manner to the second and third preferred embodiments described above, the device 300 comprises three return arms 14 arranged and connected at 120° around the actuation element 12, in a plane slightly higher than the plane in which the mobile electrodes 308 of the pairs of electrodes 4 are located.

Figure 7:
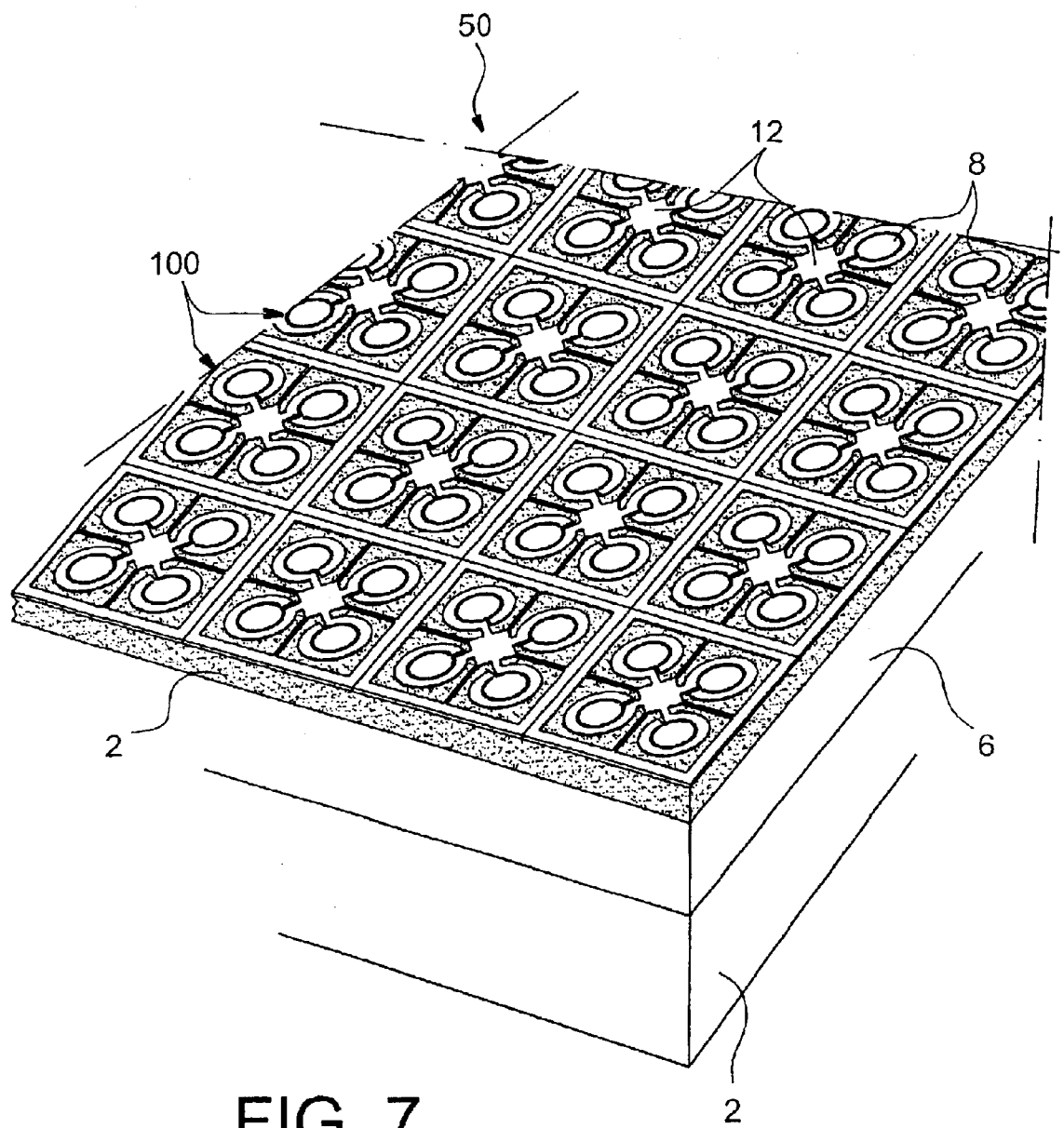
FIG. 7 shows a perspective diagrammatic view of an installation according to a preferred embodiment of this invention, comprising several miniature electrostatic actuation elements like those shown in FIG. 4.

Furthermore, the invention also relates to an installation 50 shown in FIG. 7, this installation 50 comprising several miniature electrostatic actuation elements 100 like that described in the second preferred embodiment of this invention. Obviously, the installation 50 may be composed of several actuation elements according to any one of the preferred embodiments described above without going outside the scope of the invention.

As shown in FIG. 7, the devices 100 are placed adjacent to each other. The devices 100 may be placed adjacent to each other because the external shapes of these devices 100 are complementary so that they can be assembled to each other to form a continuous surface. For example, and with reference to the preferred embodiments described above, the external shape of the miniature actuation elements may be square or hexagonal.

Thus, the installation 50 has a large number of actuation elements 12 arranged adjacent to each other, for example capable of accommodating and controlling a continuously deformable micro-mirror (not shown).

In another preferred embodiment, the installation 50 could also be provided with a support 2 common to the various devices 100. It is then possible that the support element 16 of the devices 100, the actuation element 12 of the devices 100, the mobile electrode 8 of each pair of electrodes 4 of the devices 100, and each return arm 14 of the devices 100 are made in a single piece, such that the entire upper part of the installation 50 may be made in a single operation. In this way, there is no longer any need to assemble devices 100 to each other, since they are all made simultaneously.

Obviously, a person skilled in the art may make various modifications to devices 1, 100, 200, 300 and installation 50 described above as non-limitative examples only.

What is claimed is:

1. Miniature electrostatic actuation device (1, 100, 200, 300) capable of generating movements along a determined direction (F), said device (1, 100, 200, 300) comprising at least one pair of electrodes (4) separated by an insulating layer (10), each pair of electrodes (4) being composed of a fixed electrode (6) attached to a support (2) of said device and a mobile electrode (8, 208, 308), at least one portion of which is located at a distance from the fixed electrode (6) when the device is in an inactive state, the device (1, 100, 200, 300) being capable of being activated by means of an electrical voltage applied between the two electrodes (6, 8, 208, 308) in each pair (4) causing the mobile electrode (8, 208, 308) to be pulled into contact with the fixed electrode (6) on a variable pull-in surface that varies as a function of the voltage applied between the two electrodes (6, 8, 208, 308), characterized in that the device (1, 100, 200, 300) also comprises an actuation element (12) connected to said portion of each mobile electrode (8, 208, 308) located at a distance from the associated fixed electrode (6), the actuation element (12) capable of occupying a rest position when the device is in an inactive state, and able of being guided along the determined direction (F) when the voltage applied between the two electrodes (6, 8, 208, 308) in each pair (4) varies, said device also comprising at least one return arm (14) capable of pulling the actuation element (12) back towards its rest position when the voltage applied between the two electrodes (6, 8, 208, 308) in each pair of electrodes (4) is reduced, wherein the actuation element (12) may be guided along the determined displacement direction (F) through a plurality of electrode pairs (4) comprising a common fixed electrode (4) with an approximately plane shape and mobile electrodes (8, 208, 308) arranged symmetrically with respect to the actuation element (12), the determined direction of displacement (F) of the actuation element (12) then being approximately orthogonal to the fixed electrode (6).

2. Actuation device (1, 100, 200, 300) according to claim 1, characterized in that each return arm (14) can work in tension or in bending.

3. Actuation device (1, 100, 200, 300) according to claim 1, characterized in that it includes a support element (16, 316) for each return arm (14), said element (16, 316) being fixed to the support (2) of said device.

4. Actuation device (1, 100, 200, 300) according to claim 1, characterized in that when the actuation element (12) is in its rest position, the entire mobile electrode (8, 208, 308) of each pair of electrodes (4) is kept at a distance from the fixed electrode (6) by each return arm (14), the mobile electrode (8, 208, 308) comprising the portion connected to the actuation element (12), and a second end composed of a priming area (8b, 208b, 308b) that may be pulled into contact with the fixed electrode (6) when a priming voltage is applied between the two electrodes (6, 8, 208, 308).

5. Actuation device (1, 100, 200, 300) according to claim 4, characterized in that the mobile electrode (8, 208, 308) of each pair of electrodes (4) comprises a curved arm (18, 218, 318) in a plane approximately orthogonal to the determined direction of displacement (F) of the actuation element (12), said curved arm (18, 218, 318) being connected firstly to the actuation element (12) of said device, and secondly to the priming area (8b, 208b, 308b) of said mobile electrode (8, 208, 308).

6. Actuation device (100, 200) according to claim 1, characterized in that it comprises four pairs of electrodes (4) in which the mobile electrodes (8, 208) are identical and are distributed at 90° around the actuation element (12), to be inscribed in a hollowed out space (17) with a square cross section formed in the support element (16) of each return arm (14) of said device.

7. Miniature electrostatic actuation device (1, 100, 200, 300) capable of generating movements along a determined direction (F), said device (1, 100, 200, 300) comprising at least four pairs of electrodes (4) separated by an insulating layer (10), each pair of electrodes (4) being composed of a fixed electrode (6) attached to a support (2) of said device and a mobile electrode (8, 208, 308), at least one portion of which is located at a distance from the fixed electrode (6) when the device is in an inactive state;

the mobile electrodes (8, 208) are distributed at 90° around the actuation element (12), to be inscribed in a hollowed out space (17) with a square cross section formed in the support element (16) of each return arm (14) of said device:

the device (1, 100, 200, 300) being capable of being activated by means of an electrical voltage applied between the two electrodes (6, 8, 208, 308) in each pair (4) causing the mobile electrode (8, 208, 308) to be pulled into contact with the fixed electrode (6) on a variable pull-in surface that varies as a function of the voltage applied between the two electrodes (6, 8, 208, 308), characterized in that the device (1, 100, 200, 300) also comprises an actuation element (12) connected to said portion of each mobile electrode (8, 208, 308) located at a distance from the associated fixed electrode (6), the actuation element (12) capable of occupying a rest position when the device is in an inactive state, and able of being guided along the determined direction (F) when the voltage applied between the two electrodes (6, 8, 208, 308) in each pair (4) varies, said device also comprising at least one return arm (14) capable of pulling the actuation element (12) back towards its rest position when the voltage applied between the two electrodes (6, 8, 208, 308) in each pair of electrodes (4) is reduced, and further characterized in that the mobile electrodes (8) have a disk shaped priming area (8b), and an arm (18) curved in the shape of a circular ring extending approximately all the way around the priming area (8b).

8. Actuation device (200) according to claim 7, characterized in that the mobile electrodes (208) have a rectangular shaped priming area (208b) and a curved L-shaped arm (218).

9. Actuation device (300) according to claim 1, characterized in that it comprises three pairs of electrodes (4), in which the mobile electrodes (308) are identical and are designed to be inscribed within a hollowed out space (317) with a hexagonal section formed in the support element (316) of each return arm (14) of said device.

10. Actuation device (300) according to claim 7, characterized in that the mobile electrodes (308) are arranged to have a priming area (308b) extending over a sector covering about 120° around the edge of an internal wall in the hollowed out space (317) with a hexagonal section, said priming area (308b) being prolonged by a spiral curved arm (318).

11. Actuation device (1, 100, 200, 300) according to claim 7, characterized in that any one of the two electrodes (6, 8, 208, 308) is coated with the insulating layer (10).

12. Actuation device (1, 100, 200, 300) according to claim 1, characterized in that each return arm (14) is also fixed to one of the elements among the group composed of the actuation element (12) and the portion of the mobile electrode (8, 208, 308) connected to the actuation element (12) of each pair of electrodes (4).

13. Actuation device (1, 100, 200, 300) according to claim 1, characterized in that the support element (16, 316) of each return arm (14), the actuation element (12), the mobile electrode (8, 208, 308) in each pair of electrodes (4) and each return arm (14) of said device are made in a single piece.

14. Actuation device (1, 100, 200, 300) according to claim 1, characterized in that each return arm (14) of said device is made from an electrically conducting material.

15. Actuation device (1, 100, 200, 300) according to claim 1, characterized in that for each pair of electrodes (4), the actuation element (12) and the mobile electrode (8, 208, 308) are connected by means of an elastic connection (13).

16. Installation (50) comprising a plurality of miniature electrostatic actuation devices (100), characterized in that the devices (100) are miniature electrostatic actuation devices according to claim 1, said devices (100) being adjacent to each other and provided with a common support (2).

17. Installation (50) according to claim 16, characterized in that each of the miniature electrostatic actuation devices (100) comprises a support element (16) for each return arm (14), and in that the support element (16) of the devices, the actuation element (12) of the devices, the mobile electrode (8) of each pair of electrodes (4) of the devices, and each return arm (14) of the devices are made in a single piece.

18. Actuation device (1, 100, 200, 300) according to claim 7, characterized in that when the actuation element (12) is in its rest position, the entire mobile electrode (8, 208, 308) of each pair of electrodes (4) is kept at a distance from the fixed electrode (6) by each return arm (14), the mobile electrode (8, 208, 308) comprising the portion connected to the actuation element (12), and a second end composed of a priming area (8b, 208b, 308b) that may be pulled into contact with the fixed electrode (6) when a priming voltage is applied between the two electrodes (6, 8, 208, 308).

* * * * *